United States Patent [19]

Ono

[11] Patent Number: 4,584,612
[45] Date of Patent: Apr. 22, 1986

[54] PICTURE RECORDING METHOD

[75] Inventor: Yoshio Ono, Kyoto, Japan

[73] Assignee: Dainippon Screen Seizo Kabushiki Kaisha, Japan

[21] Appl. No.: 582,072

[22] Filed: Feb. 21, 1984

[51] Int. Cl.$^4$ ............................................. H04N 1/04
[52] U.S. Cl. ................................... 358/285; 358/293; 358/297
[58] Field of Search ............... 358/285, 293, 296, 297, 358/294

[56] References Cited

U.S. PATENT DOCUMENTS 4,419,675  12/1983  Neumann et al. .................... 358/296

Primary Examiner—James J. Groody
Assistant Examiner—Edward L. Coles
Attorney, Agent, or Firm—Hayes, Davis & Soloway

[57] ABSTRACT

A desired picture or pattern such as a wiring pattern may be recorded on a recording surface bearing a photosensitive material coated thereon by sweeping a light beam obtained from a light beam source and then scanning, with the thus-swept light beam, the recording surface. Sweep position pulse signals are obtained by branching out the thus-swept light beam and detecting same with a photosensor. The light beam output from the light beam source is modulated in accordance with the sweep position pulse signals. The levels of the sweep position pulse signals are changed to a predetermined constant level in accordance with the types of their corresponding picture signals, in other words, the sweep position pulse signals are attenuated where they correspond to picture-bearing portions of the picture or pattern or are amplified where they correspond to picture-free portions of the picture or pattern, so that the synchronization between the sweeping speed and the picture signal reading-out speed is ensured. The above method is useful for the fabrication of distortion-free printed circuits.

3 Claims, 2 Drawing Figures

PICTURE RECORDING METHOD

BACKGROUND OF THE INVENTION

1. Field of the Invention:

This invention relates to a method for recording a picture such as a wiring pattern or the like by printing the picture on a picture-forming material coated with a film of a photosensitive material, such as a board suitable for use in the fabrication of a printed circuit, in accordance with input picture signals without development of dimensional distortion.

2. Description of the Prior Art:

It is proposed in U.S. Pat. Ser. No. 582,085 filed Feb. 21, 1984 claiming Convention Priority on Japanese Patent Application No. 47890/1983 of Mar. 24, 1983 and concurrently with the present case and commonly assigned to the same assignee to store two-dimensional picture data corresponding to a desired picture or pattern as digital picture signals in a memory or the like and then to form the desired picture or pattern on a picture recording material without dimensional distortion by means of a sweeping light beam controlled by the picture signals.

In the above-proposed method, a light beam having such a light quantity that does not substantially expose the picture recording material is allowed to reach the picture recording material whenever a picture-free portion of the picture recording material is scanned. A portion of the picture-recording and sweeping light beam per se is branched out, whereby to detect a position corresponding exactly to a swept point on the picture recording material. On the basis of a resulting position signal, there is produced a feedback signal which is adapted to control the timing of the optical modulation.

In the above method, a portion of a recording light beam is branched out by a half-mirror or the like and two different levels are given to the recording light beam so as to obtain position signals corresponding to sweeping light beams. Since a photosensor having a single level of sensitivity is used for sweeping light beams both when only a small light quantity that does not substantially expose the picture recording material is allowed to reach the picture recording material and when a picture portion is recorded on the picture recording material, the level of the sweeping light beam having a small light quantity and adapted to scan a picture-free potion may become unduly different from the level of the sweeping light beam having a large light quantity and adpated to scan a picture-bearing portion. The levels of resulting pulse signals may thus be varied, thereby instabilizing the processing of the light beam delivered from the light beam source which processing is supposed to be synchronized with the picture signals.

SUMMARY OF THE INVENTION

An object of this invention is to solve the above-mentioned shortcoming of the above-proposed method so that the aforementioned processing can be performed stably.

It has been unexpectedly found that the above object of this invention can be attained, for example, by providing an amplifier in a latter stage of the photosensor, changing the amplification factor of the amplifier in accordance with picture signals and feeding back feedback pulse signals, which are adapted to correct the timing of optical modulation by synchronizing the timing with picture signals, with such signal levels that permit to perfom proper digital processing thereon.

In one aspect of this invention, there is thus provided a method for recording a desired picture by, upon sweeping a light beam obtained from a light beam source and then scanning, with the thus-swept light beam, a recording surface on which a photosensitive material has been coated, branching out a portion of the swept light beam by a halfmirror, feeding the branched-out portion of the swept light beam to optical sweep position detection means, and then modulating the light beam from the light beam source in aċcordance with a picture signal obtained in synchronization with a position signal produced by the detecting means on the basis of the thus-detected portion of the swept light beam in such a way that the thus-modulated light beam is continuously maintained, at least, at such a low light quantity level that is too small to expose the photosensitive material substantially, the improvement which comprises that the level of the position signal obtained by the detecting means is changed to a predetermined level in accordance with the level of the picture signal which controls the intensity of the light beam obtained from the light beam source.

In the above method of this invention, the amplification or attenuation factor in the feedback loop is changed in accordance with the light quantity level modulated by each picture signal to be recorded, so that the detection signal of each sweep position may be either amplified or attenuated to a predetermined signal level. Therefore, position-detecting pulse signals can be obtained approximately at the same level irrelevant to the scanning portion, in other words, whether a picture-bearing portion or a picture-free portion is scanned. Consequently, the given picture or pattern can be printed without dimensional distortion.

The above and other objects, features and advantages of the present invention will become apparent from the followirg description and the appended claims, taken in conjunction with the accompanying drawings.

DETAILED DESCRIPTION OF THE INVENTION AND PREFERRED EMBODIMENT

Figure 1:
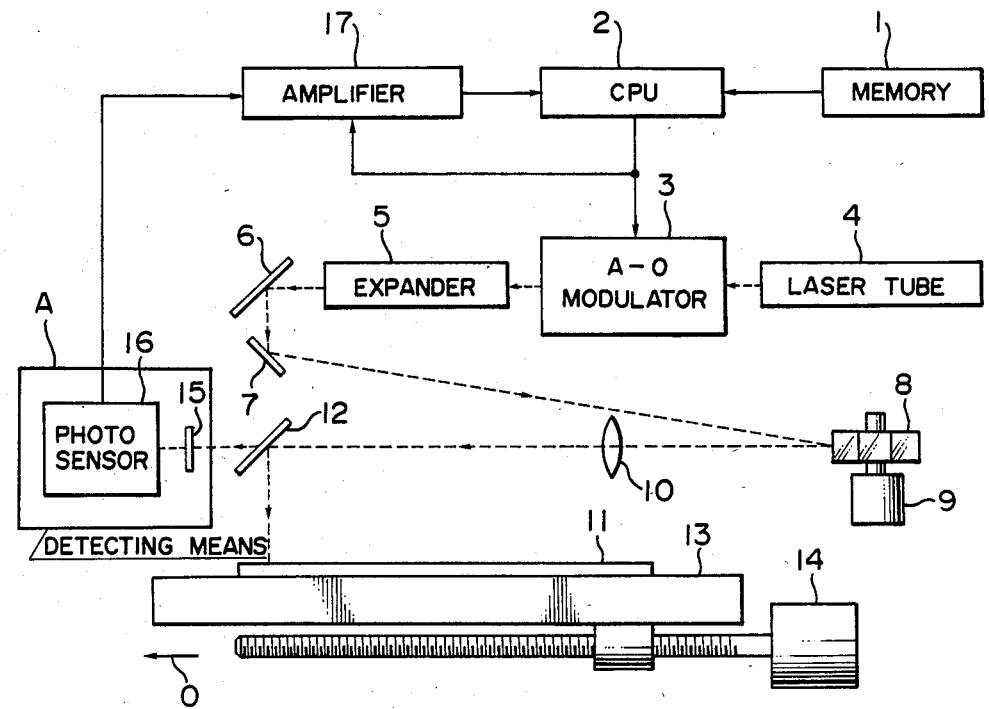
FIG. 1 is a block diagram of a direct exposure system useful in the practice of the method of this invention, which system is given by way of example.

One embodiment of the picture recording method according to this invention will hereinafter be described with reference to FIGS. 1 and 2.

In a memory 1, there are stored binary picture signals arranged two-dimensionally. The picture signals are converted by a central processing unit (hereinafter called "CPU" for the sake of brevity) 2 to time-series scanning signals for scanning purposes. The resulting scanning signals are fed to an acousto-optic light modulator 3.

A light beam output from an exposing light beam source, for example, an argon ion laser tube 4 is modulated to two types of light beams having different levels namely a light beam having an intensity strong enough to expose the picture recording material and another beam having an intensity which is too small to expose the picture recording material (i.e., the light quantity of the light beam which reaches the recording surface of the recording material after being reflected by a below-described half-mirror 12). Each of the light beams travels through an expander 5, is reflected by fixed mirrors 6,7 and impinges a polyhedral reflector 8.

The polyhedral reflector 8 is rotated by a motor 9. Accordingly, the exposing light beam are reflected by individual reflecting surfaces of the polyhedral reflector 8 and thus swept in a direction perpendicular to the sheet of the drawing with a prescribed spread angle.

Then, the exposing light beam travels through a focusing lens 10 arranged very close to the polyhedral reflector 8 and is thereafter reflected by a half-mirror 12 disposed at a position adjacent to an insulated board 11 suitable for use in the fabrication of a printed circuit. The light beam then sweeps and radiates the unexposed insulated board 11 while forming image points thereon.

The insulated board 11 is fixedly mounted on a stage 13, which is movable at a constant speed in a subscanning direction (i.e., in the direction indicated by an arrow 0 in the figure) owing to the provision of a motor 14.

When the polyhedral reflector 8 is rotated and the stage 13 is moved, the surface of the insulated board 11 is thus plane-scanned successively, at the image point of the exposing light beam, thoroughly.

Figure 2:
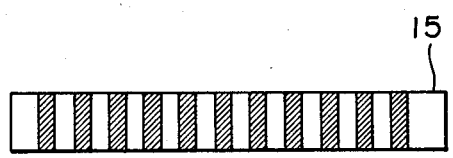
FIG. 2 is a front view illustrating one example of a narrow grille-like scale.

On the other hand, the light beam which has passed through the half-mirror 12 reaches optical sweep position detecting means A formed of a narrow grille-like scale 15, the details of which are shown in FIG. 2, and a photosensor 16. This grill-like scale 15 is disposed at a position conjugate with the position to be exposed on the insulated board (printed substrate) 11. A feedback circuit is formed between the photosensor 16 and the CPU 2 to deliver pulse signals from the photosensor 16 to the CPU 2 by way of an amplifier 17 interposed therebetween.

Since a portion of the laser beam, the remaining portion of which laser beam is not reflected toward the insulated board 11, passes through the half-mirror 12 and then sweeps the narrow grille-like scale 15, that portion of the laser beam is then input to the photosensor 16 while being intermittently allowed to pass through the openings of the scale 15.

Accordingly, the laser beam which has passed through the narrow grille-like scale 15 is converted to pulse signals at the photosensor 16 in accordance with the sweeping speed of the laser beam. The pulse signals serve to provide position information indicating the corresponding exposing point of the swept light beam on the insulated circuit 11, for example, by counting the number of the pulse signals or a similar method. The pulse signals are then amplified by the amplifier 17, the amplification factor of which is variable, and are thereafter fed back to the CPU 2.

A binary picture signal read out from the CPU 2 has already been input as an amplification factor controlling signal to the amplifier 17. The amplifier 17 changes over its amplification factor, depending whether the picture signal is at a high level or at a low level. Thus, the amplification factor is changed to a low level when the levels of pulse signals are high. It is changed to a high level when the levels of pulse signals are low. Owing to the provision of the amplifier 17, it is possible to obtain pulse signals having a prescribed constant level although the photosensor 16 outputs pulse signals having various different levels.

Therefore, in the case of a laser beam modulated in accordance with a picture signal corresponding to a picture-free portion and allowing a small quantity of laser beam light to pass through the narrow grille-like scale 15, the amplification factor is increased for its corresponding pulse signals so that the S/N ratio of each piece of position information to be fed back to the CPU 2 is improved 20 and the timing control can hence be performed precisely at the CPU 2.

In the case of a laser beam modulated in accordance with a picture signal corresponding to a picture-bearing portion and having a great light quantity, the amplification factor is decreased for its corresponding pulse signals so that pulse signals corresponding to each picture-bearing portion become substantially equal in level to those corresponding to each picture-free portion.

Pulse signals, which have been output from the photosensor 16, are cut at a suitable threshold level by known technique in the above-mentioned manner, thereby feeding back the pulse signals as rectangular waves. They are then converted to high frequency pulses by a PLL circuit or the like. A count data on the thus-converted pulses is input to the CPU 2, whereby to control the picture signal reading-out speed from the momory 1 in which picture signals are stored. Accordingly, it is possible to record a picture or pattern while achieving exact synchronization between the revolution speed of the polyhedral reflector 8 and the picture signal reading-out speed.

In the above embodiment, the laser beam corresponding to a picture-free portion and that corresponding to a picture-bearing portion are both converted to detected sweep position pulse signals at the photosensor 16 by way of the half-mirror 12 and narrow grille-like reflector 15. The amplification factors for both types of the pulse signals are respectively changed by picture signals corresponding to the picture-free portion and the picture-bearing portion of the picture or pattern to be recorded. In some instances, it may be better to attenuate only detected sweep portion pulse signals obtained from laser beams corresponding to picture-bearing portions. In some other instances, it may be better to amplify only detected sweep position pulse signals obtained from laser beams corresponding to picture-free positions.

The amplification factor may be changed by changing over the ratio of a feedback resistor and input resistor of an operational amplifier by an analog switch or the like where the amplifier 17 is formed of the operational amplifier or by providing two types of amplifiers, attenuators or the like and changing over their outputs by means of an analog switch or the like, so that sweep position pulse signals of the same level can be output from the amplifier 17.

Accordingly, picture signals read out from the momory 1 are converted to time-series scanning signals synchronized precisely with the beam sweeping speed, thereby recording a tortion-free picture or pattern on the insulated board 11.

The above embodiment has been described supposing that an insulated board is exposed to fabricate a printed circuit. Needless to say, the present invention may be equally applied to other picture recording materials (for example, photographic films, heat-sensitive materials suitable for exposure by infrared laser beams, etc.).

In the above embodiment of this invention, the amplification or attenuation factor in the feedback loop is changed in accordance with the level of light quantity of the light beam modulated by each picture signal to be recorded so that the resulting sweep position pulse signal can be either amplified or attenuated to a prescribed pulse signal level. Therefore, it is always possible to obtain detected position pulse signals of substantially the same level whether picture-bearing or picture-free portions are scanned, whereby allowing to print a prescribed picture or pattern without dimensional distortion.

Having now fully described the invention, it will be apparent to one of ordinary skill in the art that many changes and modifications can be made thereto without departing from the spirit or scope of the invention as set forth herein.

What is claimed is:

1. In a method for recording a desired picture by, upon sweeping a light beam obtained from a single modulated light beam source and then scanning, with the thus-swept light beam, a recording surface on which a photosensitive material has been coated, branching out a portion of swept light beam by a half-mirror, feeding the branching-out portion of the swept light beam to optical sweep position detecting means, and then modulating the light beam from the light beam source in accordance with a picture signal obtained in synchronization with a position signal produced by the detecting means on the basis of the thus-detected portion of the swept light beam in such a way that one of the thus-modulated light beams is continuously maintained, at least, at such a low light quantity level that is too small to expose the photosensitive material substantially, and in the case of recording the picture the other modulated light beam having a high light quantity level which is sufficient for substantially exposing the photosensitive material, the improvement which comprises that the level of the position signal obtained by the detecting means is changed to a predetermined level in accordance with the level of the picture signal which controls the intensity of the light beam obtained from the light beam source.

2. The recording method as claimed in claim 1, wherein the optical sweep position detecting means is provided at the output side thereof with means adapted to change the amplification factor for the position signal depending whether the level of the picture signal is low or high.

3. The recording method as claimed in claim 1, wherein the optical sweep position detecting means is provided at the output side thereof with means adapted to amplify the position signal when the level of the picture signal is low but to attenuate the position signal when the level of the picture signal is high.

* * * * *